United States Patent
Ji

(10) Patent No.: US 11,791,009 B2
(45) Date of Patent: *Oct. 17, 2023

(54) ERROR CORRECTION SYSTEM

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/668,715

(22) Filed: Feb. 10, 2022

(65) Prior Publication Data

US 2022/0223221 A1    Jul. 14, 2022

Related U.S. Application Data

(63) Continuation of application No. PCT/CN2021/111492, filed on Aug. 9, 2021.

(30) Foreign Application Priority Data

Jan. 14, 2021 (CN) .......... 202110049134.2

(51) Int. Cl.
*G11C 29/42* (2006.01)
*G11C 29/12* (2006.01)
(Continued)

(52) U.S. Cl.
CPC ........ *G11C 29/42* (2013.01); *G11C 29/12005* (2013.01); *G11C 29/18* (2013.01);
(Continued)

(58) Field of Classification Search
CPC ... H04L 1/0057; H04L 1/0061; H04L 1/0066; H04L 1/007; H04L 2001/0098;
(Continued)

(56) References Cited

U.S. PATENT DOCUMENTS 4,736,376 A * 4/1988 Stiffler .................. G06F 11/10
714/801
5,859,858 A   1/1999 Leeman
(Continued)

FOREIGN PATENT DOCUMENTS

CN     1242088 A     1/2000
CN     1881477 A    12/2006
(Continued)

OTHER PUBLICATIONS

Notice of Allowance of the Japanese application No. 2022-538835, dated Aug. 8, 2023. 3 pages with English translation.
(Continued)

*Primary Examiner* — Cynthia Britt
*Assistant Examiner* — Sazzad Hossain
(74) *Attorney, Agent, or Firm* — Cooper Legal Group, LLC

(57) ABSTRACT

An error correction system includes M decoding units, each configured to perform decoding on the X first operation codes and the Y second operation codes; the decoding unit includes: a decoder, configured to receive the X first operation codes and output N first decoded signals, each corresponding to a respective one bit of the N data; a first AND gate unit, configured to receive and perform a logical AND operation on Z selected operation codes; an NOR gate unit, configured to receive and perform a logical NOR operation on (Y−Z) unselected operation codes; and N second AND gate units, each having an input terminal connected to an output terminal of the first AND gate unit, an output terminal of the NOR gate unit and one of the first decoded signals.

15 Claims, 5 Drawing Sheets

(51) Int. Cl.
    *H03K 19/20*       (2006.01)
    *G11C 29/18*       (2006.01)
    *H04L 1/00*        (2006.01)
    *H03M 13/29*       (2006.01)
    *G11C 29/52*       (2006.01)
    *H03M 13/35*       (2006.01)
    *H03M 13/00*       (2006.01)
    *H03M 13/13*       (2006.01)
    *G06F 9/38*        (2018.01)

(52) U.S. Cl.
    CPC ........... *H03K 19/20* (2013.01); *G06F 9/3869* (2013.01); *G11C 29/52* (2013.01); *G11C 2029/1802* (2013.01); *H03M 13/13* (2013.01); *H03M 13/2927* (2013.01); *H03M 13/356* (2013.01); *H03M 13/6561* (2013.01); *H04L 1/0057* (2013.01); *H04L 1/0061* (2013.01); *H04L 1/0066* (2013.01); *H04L 2001/0098* (2013.01)

(58) Field of Classification Search
    CPC ......... H03M 13/2927; H03M 13/6561; H03M 13/13; H03M 13/356; G06F 9/3869; G11C 29/52; G11C 29/42; G11C 29/12005; G11C 29/18; G11C 2029/1802; H03K 19/20
    See application file for complete search history.

(56) References Cited

U.S. PATENT DOCUMENTS

| | | | |
|---|---|---|---|
| 5,936,870 | A | 8/1999 | Im |
| 7,242,219 | B1 | 7/2007 | Mahurin |
| 7,653,862 | B2 | 1/2010 | Hassner |
| 8,225,175 | B2 | 7/2012 | Chen |
| 8,560,916 | B2 | 10/2013 | Yang |
| 8,862,963 | B2 | 10/2014 | Nakanishi |
| 9,411,686 | B2 | 8/2016 | Yang et al. |
| 9,754,684 | B2 | 9/2017 | Hu et al. |
| 9,985,655 | B2 | 5/2018 | Jeganathan et al. |
| 9,985,656 | B2 | 5/2018 | Jeganathan et al. |
| 11,599,417 | B2 | 3/2023 | Ji |
| 2004/0095666 | A1 | 5/2004 | Asano |
| 2005/0273678 | A1 | 12/2005 | Dietrich |
| 2007/0011598 | A1 | 1/2007 | Hassner |
| 2009/0106633 | A1* | 4/2009 | Fujiwara ............... H03M 13/13 714/785 |
| 2011/0191651 | A1 | 8/2011 | Chen |
| 2011/0239082 | A1 | 9/2011 | Yang |
| 2012/0311408 | A1 | 12/2012 | Nakanishi |
| 2015/0058700 | A1 | 2/2015 | Yang et al. |
| 2017/0060677 | A1 | 3/2017 | Jeganathan et al. |
| 2017/0060679 | A1 | 3/2017 | Jeganathan et al. |
| 2017/0222664 | A1* | 8/2017 | Tsuboi ................. H03M 13/29 |
| 2017/0353271 | A1 | 12/2017 | Kudekar et al. |
| 2018/0205498 | A1 | 7/2018 | Kudekar et al. |
| 2019/0034270 | A1 | 1/2019 | Byun et al. |
| 2019/0280817 | A1 | 9/2019 | Kudekar et al. |
| 2022/0223186 | A1 | 7/2022 | Ji |
| 2022/0223221 | A1 | 7/2022 | Ji |
| 2022/0230701 | A1 | 7/2022 | Ji |

FOREIGN PATENT DOCUMENTS

| | | |
|---|---|---|
| CN | 101183565 A | 5/2008 |
| CN | 101980339 A | 2/2011 |
| CN | 102339641 A | 2/2012 |
| CN | 102543209 A | 7/2012 |
| CN | 102810336 A | 12/2012 |
| CN | 102857217 A | 1/2013 |
| CN | 103078629 A | 5/2013 |
| CN | 104425019 A | 3/2015 |
| CN | 105471425 A | 4/2016 |
| CN | 105471425 B | 5/2018 |
| CN | 108038023 A | 5/2018 |
| CN | 109036493 A | 12/2018 |
| CN | 109308228 A | 2/2019 |
| CN | 110968450 A | 4/2020 |
| CN | 111443887 A | 7/2020 |
| JP | S61277230 A | 12/1986 |
| JP | S63102510 A | 5/1988 |
| JP | H07212222 A | 8/1995 |
| JP | 2010079485 A | 4/2010 |
| JP | 2012022422 A | 2/2012 |
| JP | 2013074560 A | 4/2013 |

OTHER PUBLICATIONS

First Office Action of the U.S. Appl. No. 17/627,013, dated Jun. 8, 2023. 38 pages.
First Office Action of the Japanese application No. 2022-538785, dated Aug. 22, 2023, 5 pages with English translation.
First Office Action of the Japanese application No. 2022-538713, dated Aug. 1, 2023. 8 pages with English translation.

* cited by examiner

FIG. 4

| Byte | 0 | | | | | | | |
|---|---|---|---|---|---|---|---|---|
| Bit | 0 | 1 | 2 | 3 | 4 | 5 | 6 | 7 |
| pc0 |  | × |  | × |  | × |  | × |
| pc1 |  |  | × | × |  |  | × | × |
| pc2 |  |  |  |  | × | × | × | × |

| Byte | 0 | 1 | 2 | 3 | 4 | 5 | 6 | 7 | 15 | 14 | 13 | 12 | 11 | 10 | 9 | 8 |
|---|---|---|---|---|---|---|---|---|---|---|---|---|---|---|---|---|
| pc3 | × |  | × | × | × | × | × |  |  |  |  |  |  |  |  | × |
| pc4 | × | × |  |  | × | × |  | × |  |  |  | × |  | × | × |  |
| pc5 |  | × | × |  | × |  | × |  |  |  | × | × |  | × |  | × |
| pc6 |  |  |  | × |  | × | × | × | × | × |  |  | × | × |  |  |
| pc7 |  |  |  |  |  |  |  |  |  | × |  | × | × | × | × | × |

US 11,791,009 B2

ERROR CORRECTION SYSTEM

CROSS-REFERENCE TO RELATED APPLICATIONS

This is a continuation of International Application No. PCT/CN2021/111492, filed on Aug. 9, 2021, which claims priority to Chinese Patent Application No. 202110049134.2, filed on Jan. 14, 2021. The entire contents of International Application No. PCT/CN2021/111492 and Chinese Patent Application No. 202110049134.2 are incorporated herein by reference.

TECHNICAL FIELD

Embodiments of the disclosure relate to, but are not limited to, an error correction system.

BACKGROUND

Semiconductor memories may be divided into non-volatile memories and volatile memories. As a volatile memory, Dynamic Random Access Memory (DRAM) has advantages of high memory density, fast read and write speed, etc., and thus is widely used in various electronic systems.

As the process of DRAM becomes more and more advanced and the memory density thereof becomes higher and higher, errors may occur when data is stored in DRAM, seriously affecting the performance of DRAM. Thus, Error Checking and Correction (ECC) or Error correction Coding (ECC) techniques are commonly used in DRAM to detect or correct errors in stored data.

SUMMARY

Embodiments of the disclosure provide an error correction system applied to a memory system which is configured to, during a read or write operation, write or read multiple data, here the multiple data are divided into M bytes, each having N data with different bits, and the memory system has an encoding stage and a decoding stage, during the decoding stage, the error correction system generates X first operation codes and Y second operation codes based on the memory system, here the first operation codes are configured for at least one of error detection or error correction on the N data, and the second operation codes are configured for at least one of error detection or error correction on the M bytes; in which the error correction system includes: M decoding units, each corresponding to a respective one of the bytes, and configured to perform decoding on the X first operation codes and the Y second operation codes to determine whether the respective byte has erroneous data and to locate one or more bits of the erroneous data; here the decoding unit includes:

a decoder, configured to receive the X first operation codes and output N first decoded signals, each of the N first decoded signals corresponding to a respective one bit of the N data, and N being greater than X; a first AND gate unit, configured to receive and perform a logical AND operation on Z selected operation codes, the selected operation codes being a subset of the Y second operation codes corresponding to the respective byte; an NOR gate unit, configured to receive and perform a logical NOR operation on (Y−Z) unselected operation codes, the unselected operation codes being second operation codes other than the selected operation codes; and N second AND gate units, each having an input terminal connected to an output terminal of the first AND gate unit, an output terminal of the NOR gate unit and one of the first decoded signals, here at least one of error detection or error correction is performed on the memory system based on the output of the N second AND gate units, here each of X, Y and N is a positive natural number, and Z is an integer which is greater than or equal to (Y−1)/2 and smaller than or equal to (Y+1)/2.

BRIEF DESCRIPTION OF THE DRAWINGS

One or more embodiments are exemplified by pictures in accompanying drawings corresponding thereto, which do not constitute limitations of the embodiments. An element having the same reference numeral in the drawings is designated as a similar element, and figures in the drawings do not constitute limitations of a scale, unless stated specifically.

FIG. 4 is a schematic diagram of a classification of multiple data and a relationship thereof with first check codes and second check codes according to an embodiment of the disclosure;

DETAILED DESCRIPTION

Embodiments of the disclosure provide an error correction system applied to a memory system which is configured to, during a read or write operation, write or read multiple data, here the multiple data are divided into M bytes, each having N data with different bits, and during a decoding stage, the memory system generates X first operation codes and Y second operation codes, here the first operation codes are configured for at least one of error detection or error correction on the N data, and the second operation codes are configured for at least one of error detection or error correction on the M bytes; in which the error correction system includes: M decoding units, each corresponding to a respective one of the bytes; here the decoding unit includes: a decoder, configured to receive the X first operation codes and output N first decoded signals, and configured to locate one or more bits of the erroneous data; a first AND gate unit and an NOR gate unit, configured to locate erroneous bytes; and N second AND gate units, each having an input terminal connected to a respective output terminal of the first AND gate unit and a respective output terminal of the NOR gate unit, and configured to determine whether the respective byte is erroneous and to locate one or more bits of the erroneous data. In the embodiment of the disclosure, the circuit of the decoding unit corresponding to each of the bytes may be configured as to be the same, except that the first operation code and the second operation code connected to input terminals of different decoding units are different, which is conducive to saving the wires and areas of all the decoding units in the error correction system, and performing decoding on all the bytes at the same time for at least one of error detection or error correction. Therefore, error detection and error correction speeds of the error correction system may be improved.

In order to make the objectives, technical solutions and advantages of the embodiments of the disclosure clearer, the embodiments of the disclosure will be described in detail below with reference to the accompanying drawings. However, it may be understood by those of ordinary skill in the art that in the embodiments of the disclosure, many technical details have been proposed for a reader to better understand the disclosure. However, even without these technical details and various changes and modifications based on the following embodiments, the technical solutions claimed herein may be realized.

Figure 1:
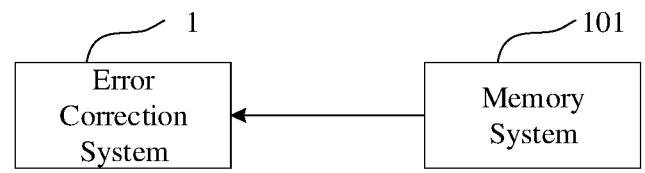
FIG. 1 is a functional block diagram of an error correction system and a memory system according to an embodiment of the disclosure.
Figure 2:
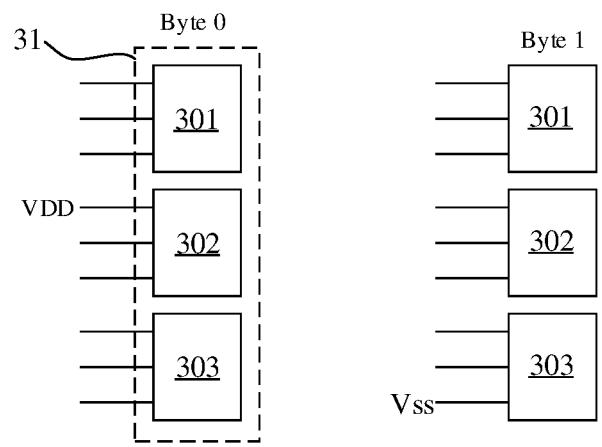
FIG. 2 is a first schematic structural diagram of an error correction system according to an embodiment of the disclosure.
Figure 3:
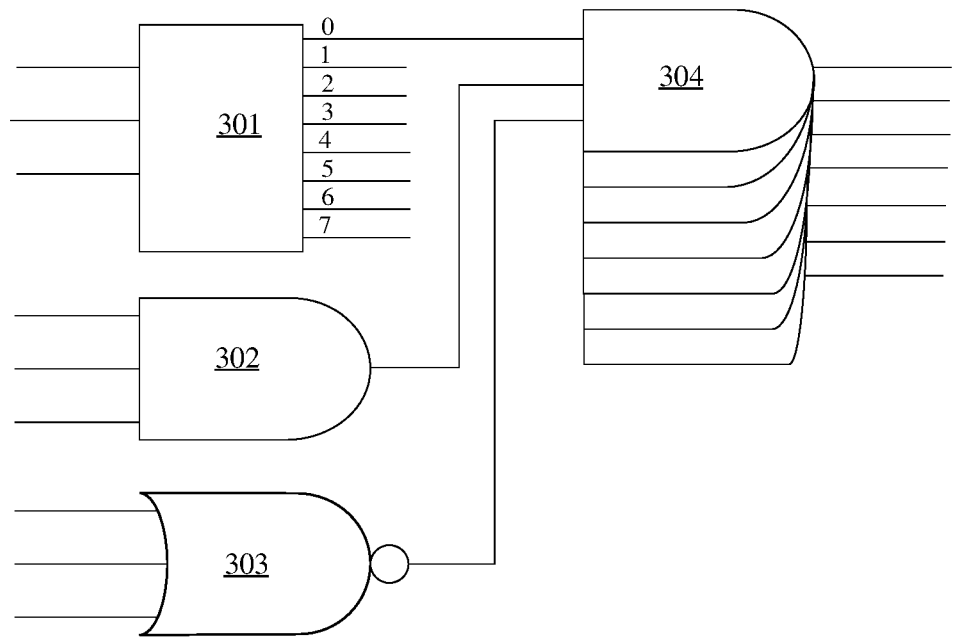
FIG. 3 is an enlarged schematic structural diagram of a decoding unit corresponding to each of the bytes in FIG. 2.

FIG. 1 is a functional block diagram of an error correction system and a memory system according to an embodiment of the disclosure, FIG. 2 is a first schematic structural diagram of an error correction system according to an embodiment of the disclosure, and FIG. 3 is an enlarged schematic structural diagram of a decoding unit corresponding to each of the bytes in FIG. 2.

Referring to FIGS. 1-3, in the embodiment of the disclosure, an error correction system 1 is applied to a memory system 101 which is configured to, during a read or write operation, write or read multiple data, here the multiple data are divided into M bytes, each having N data with different bits, and the memory system 101 has an encoding stage and a decoding stage, during the decoding stage, the error correction system 1 generates X first operation codes and Y second operation codes based on the memory system 101, here the first operation codes are configured for at least one of error detection or error correction on the N data, and the second operation codes are configured for at least one of error detection or error correction on the M bytes; the error correction system 1 further includes: M decoding units 31, each corresponding to a respective one of the bytes, and configured to perform decoding on the X first operation codes and the Y second operation codes to determine whether the respective byte has erroneous data and to locate one or more bits of the erroneous data.

Here the decoding unit 31 includes: a decoder 301, configured to receive the X first operation codes and output N first decoded signals, each of the N first decoded signals corresponding to a respective one bit of the N data, and N being greater than X; a first AND gate unit 302, configured to receive and perform a logical AND operation on Z selected operation codes, the selected operation codes being a subset of the Y second operation codes corresponding to the respective byte; an NOR gate unit 303, configured to receive and perform a logical NOR operation on (Y−Z) unselected operation codes, the unselected operation codes being second operation codes other than the selected operation codes; and N second AND gate units 304, each having an input terminal connected to an output terminal of the first AND gate unit 302, an output terminal of the NOR gate unit 303 and one of the first decoded signals, here at least one of error detection or error correction is performed on the memory system 101 based on the output of the N second AND gate units 304; here each of X, Y and N is a positive natural number, and Z is an integer which is greater than or equal to (Y−1)/2 and smaller than or equal to (Y+1)/2.

It should be noted that in the embodiment of the disclosure, the first operation code is configured for at least one of error detection or error correction on N data in each of the bytes, and the second operation code is configured for at least one of error detection or error correction on the M bytes. It should be understood that all the first operation codes and the second operation codes are configured together for at least one of error detection or error correction on all data in the M bytes, the second operation code is configured to locate one of the M bytes where erroneous data is located, and the first operation code is configured to locate one of the bits, where erroneous data is located, of the byte.

FIG. 2 illustrates a schematic structural diagram of a decoding unit corresponding to two bytes, and an error correction system according to an embodiment of the disclosure will be described in detail below with reference to the accompanying drawings.

In the embodiment of the disclosure, X is 4 and N is 8, and accordingly, the decoder 301 is a three-eight decoder and has three input terminals and eight output terminals; and a number of the second AND gate units 304 is 8, that is, N is 8.

Since Z is an integer which is greater than or equal to (Y−1)/2 and smaller than or equal to (Y+1)/2, the sum of a number of input terminals of the first AND gate unit 302 and a number of input terminals of the NOR gate unit 303 is minimal, and both the input terminals of the first AND gate unit 302 and the input terminals of the NOR gate unit 303 may be utilized effectively.

In some embodiments of the disclosure, Y is 5, and then Z is greater than or equal to 2 and smaller than or equal to 3. When the first AND gate unit 302 receives two selected operation codes, that is, the first AND gate unit 302 needs two input terminals, the NOR gate unit 303 receives three unselected operation codes, that is, the NOR gate unit 303 needs three input terminals; when the first AND gate unit 302 receives three selected operation codes, that is, the first AND gate unit 302 needs three input terminals, the NOR gate unit 303 receives two unselected operation codes, that is, the NOR gate unit 303 needs two input terminals.

In some embodiments of the disclosure, the first AND gate unit 302 has three input terminals, and is further configured to connect one of the input terminals of the first AND gate unit 302 to a power supply VDD when a number of the selected operation codes is 2. Accordingly, the NOR gate unit 303 has three input terminals, and is further configured to connect one of the input terminals of the NOR gate unit 303 to the ground Vss when a number of the unselected operation codes is 2.

Since the first operation code is configured for at least one of error detection or error correction on the N data, when the memory system has one-bit erroneous data, from the N first decoded signals outputted from the decoder 301, it may be known in which bit of the N-bit data the erroneous data is present, but it cannot be known in which byte the bit corresponding to the erroneous data is present.

The selected operation codes are the second operation codes in a subset of the Y second check codes corresponding to the respective byte, and the correspondence herein means that the data of the byte participates in the encoding operation of the second operation code. In the embodiment of disclosure, each of the Y second operation codes is obtained by performing an encoding operation on all data in different bytes. It may be understood that for a byte, when all data in the byte participates in the second operation codes obtained by the encoding operation, the second operation code is defined as a second operation code corresponding to the byte. It is not difficult to find that the second operation codes obtained by different bytes participating in the encoding operation are not exactly the same, the Y second operation codes may be configured for at least one of error detection or error correction of the M bytes.

Since the second operation codes are configured for at least one of error detection or error correction of M bytes, the second operation codes corresponding to the byte, i.e., the selected operation codes, are input to the first AND gate unit 302. When the memory system has one-bit erroneous data and the data in the byte is erroneous, the selected operation codes are affected, so that an output result of the first AND gate unit 302 is affected. The second operation codes, other than the selected operation codes, of all the second operation codes are unselected operation codes which are input to the NOR gate unit 303. When the memory system has one-bit erroneous data and the data in the byte is erroneous, the unselected operation codes are not affected, and an output result of the NOR gate unit 303 is not affected. Similarly, when the memory system has one-bit erroneous data and none of the data in the byte is erroneous, the unselected operation codes are affected and the output result of the NOR gate unit 303 is affected.

Each of the second AND gate units 304 is connected to a first decoded signal, an output terminal of the first AND gate unit 302 and an output terminal of the NOR gate unit 303, so that an output terminal of each of the second AND gate units 304 is affected by the data of each bit in the byte, that is, it may be known from the output terminal of the second AND gate unit 304 whether the data corresponding to the bits of the byte are erroneous or not.

For example, when the byte has one-bit erroneous data and the erroneous data is located at the first bit, the first decoded signal corresponding to the first bit is defined as a marking decoded signal, and then an output result of the second AND gate unit 304 receiving the marking decoded signal does not meet an expectation and is different from output results of other second AND gate units 304, so that the data of the first bit is derived as the erroneous data in an inversed way. When all data in the byte are correct data, the output results of all the second AND gate units 304 are the same and meet the expectation, so that the erroneous data which is derived is not in the byte in the inversed way.

It may be appreciated that in some embodiments of the disclosure, the memory system 101 includes a memory chip in which M decoding units 31 may be integrated.

In the error correction system 1 provided in the embodiment of the disclosure, the decoding units 31, each corresponding to a respective one of the bytes, may be configured as same circuits, except that the first operation codes and the second operation codes connected to input terminals of different decoding units 31 are different, which is conducive to saving wires and areas of all the decoding units in the error correction system, and performing decoding on all the bytes at the same time to perform at least one of error detection or error correction. Therefore, speeds of error detection and error correction of the error correction system may be improved.

The error correction system will be further described below with reference to the principle of operation of the memory system.

In the embodiment of the disclosure, the memory system 101 may be a DRAM, and for example, may be Double Data Rate4 (DDR4), Low Power DDR4 (LPDDR4), DDR5, or LPDDR5. The memory system 101 may be other types of memory systems, such as non-volatile memories such as NAND, NOR, Ferroelectric Random Access Memory (FeRAM), Phase change Random Access Memory (PcRAM), and the like.

For the memory system 101, data is partitioned into different bytes, and typically, a byte is a basic unit in data processing. The information is stored and interpreted in bytes, and it is specified that one byte is composed of eight binary bits, that is, one byte is equal to eight bits, each of which has a corresponding bit, i.e., 1 Byte=8 bits. Based on this, in the embodiment of the disclosure, N is eight to maximize the bits in each byte, thereby facilitating to increase a utilization rate of a circuit required by the comparison system 20. It may be understood that in other embodiments, N may also be another suitable positive integer.

For example, when the data transmitted by the memory system 101 during a single read or write operation has 128 bits (i.e., 128-bit), then M is 16 and N is 8. It should be noted that in other embodiments, depending on the number of bits of data transmitted by the memory system during the read or write operation, M may be another suitable positive integer, as long as M*N is equal to the number of bits of data transmitted during the read or write operation.

Figure 4:
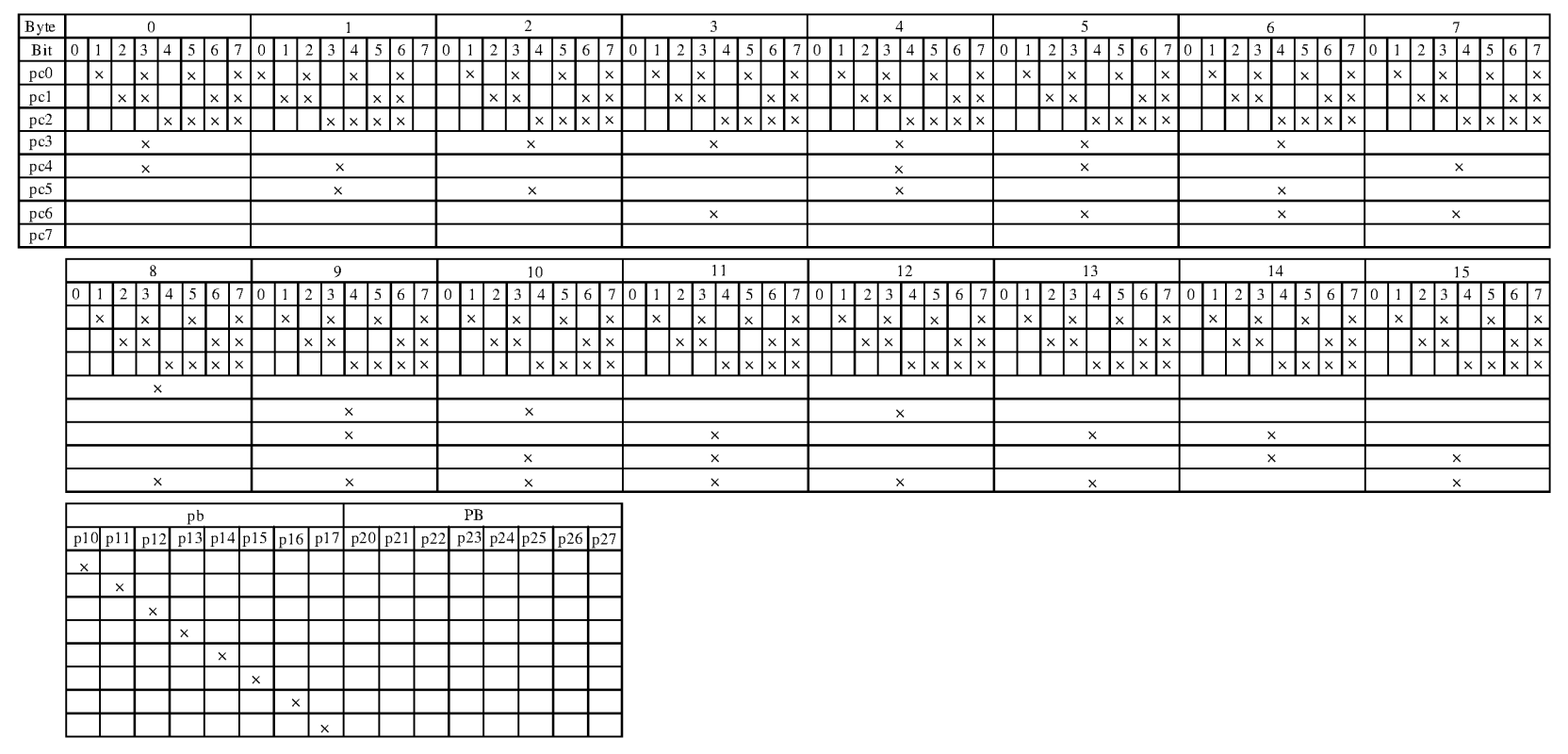

FIG. 4 is a schematic diagram of a classification of multiple data and a relationship thereof with first check codes and second check codes according to an embodiment of the disclosure. Each of N data has different bits. In the embodiment of the disclosure, as shown in FIG. 4, for each byte, the N data have bits numbered from zero to seven, which are incremental by a natural number; for all bytes, M bytes are partitioned into sixteen bytes numbered from zero to fifteen, which are incremental by a natural number. In addition, for different bytes, each of the N data in the byte has eight bits numbered from zero to seven. It should be noted that in FIG. 4, a table which is actually in the same row is split into three tables due to space limitations, which is actually a complete table. For ease of illustration, FIG. 5 schematically illustrates a schematic enlarged diagram of a first check code corresponding to byte 0.

Figures 5, 6, 7:
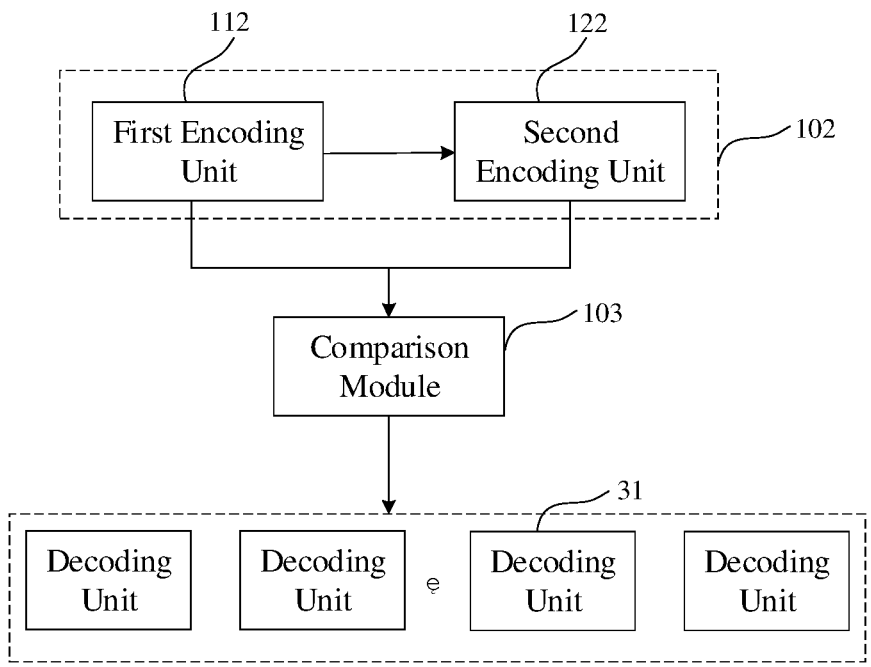
FIG. 5 schematically illustrates an enlarged diagram of a first check code corresponding to byte 0.
FIG. 6 is a second schematic structural diagram of an error correction system according to an embodiment of the disclosure.
FIG. 7 schematically illustrates a schematic principle diagram of performing a second encoding operation on all bytes.

FIG. 6 is a second schematic structural diagram of an error correction system according to an embodiment of the disclosure.

Referring to FIG. 6, the error correction system 1 further includes: an encoding module 102, configured to, during the encoding stage of the read operation and the write operation, generate X first check codes, each based on a subset of the data at fixed bits among all the bytes, and to generate Y second check codes, each based on all data in a subset of the bytes, where the X first check codes are configured for at least one of error detection or error correction on the N data in each of the bytes, and the Y second check codes are configured for at least one of error detection or error correction on the M bytes, and each of X and Y is a positive natural number.

The first check code(s) is/are configured for at least one of error detection or error correction on N data in each of the bytes, and the second check code(s) is/are configured for at least one of error detection or error correction on M bytes. The encoding mode based on error detection and error correction may not only implement ECC, but also implement ECC by using fewer hardware circuits, which facilitates to reduce power consumption of the memory system and optimize speed and result of ECC.

It should be noted that in the embodiment of the disclosure, the first check code(s) is/are configured for at least one of error detection or error correction on N data in each of the bytes, and the second check code(s) is/are configured for at least one of error detection or error correction on M bytes. It should be understood that all the first check code(s) and the second check code(s) are configured together for at least one of error detection or error correction on all data in the M bytes, the second check code(s) is/are configured to locate one of the M bytes where erroneous data is located, and the first check code(s) is/are configured to locate one of the bits, where erroneous data is located, of the byte.

In the embodiment of the disclosure, the encoding module 102 generates a first check code and a second check code by using a parity check principle, and accordingly, each of the first check code and the second check code is a parity check code.

In the embodiment of the disclosure, the encoding module 102 includes: a first encoding unit 112, configured to acquire the X first check codes and the Y second check codes based on multiple data written during the write operation; and a second encoding unit 122, configured to obtain X first updated check codes and Y second updated check codes based on multiple data to be read during the read operation, here a way of obtaining the first updated check codes is the same as a way of obtaining the first check codes, and a way of obtaining the second updated check codes is the same as a way of obtaining the second check codes; here the first operation codes are obtained based on the first check codes and the first updated check codes, and the second operation codes are obtained based on the second check codes and the second updated check codes.

The X first check codes constitute an X-bit first binary number; here $2^X$ is greater than or equal to N, each of the first check codes is obtained by performing a first encoding operation on the subset of the data in all the bytes, and the X first check codes correspond to X subsets of the data in a one-to-one manner, different subsets corresponding to different bit combinations in the bytes. That is, each of the first check codes is obtained by selecting data of multiple bits in each of the bytes to perform the first encoding operation, and the selected bit combinations in all bytes are the same for the same first check code, and the selected bit combinations in N data are different for different first check codes.

In the embodiment of the disclosure, different first check codes are obtained by performing the first encoding operation based on different data in all bytes, so that the bits affecting the result of the first check code are different for different first check codes. Furthermore, since $2^X$ is greater than or equal to N, the first check codes obtained by selecting each of the bits to perform the first encoding operation may not be exactly the same, so that the bit corresponding to the erroneous data may be obtained by analysis.

In the embodiment of the disclosure, X is 3, so that errors of data of different bits may be identified, and the complexity of the hardware circuit of the first encoding unit 112 may be reduced.

In some embodiments of the disclosure, the three first check codes include a first check code at the zeroth bit, a first check code at the first bit, and a first check code at the second bit in a sequence from a lowest bit to a highest bit, and the N data have bits from zero to N−1, which are incremental by a natural number, for example, the zeroth bit does not participate in the first encoding operation corresponding to any of the first check codes; the first bit participates in the first encoding operation corresponding to the first check code at the zeroth bit; the second bit participates in the first encoding operation corresponding to the first check code at the first bit; the third bit participates in the first encoding operation corresponding to the first check codes at the zeroth and first bits; the fourth bit participates in the first encoding operation corresponding to the first check code at second bit; the fifth bit participates in the first encoding operation corresponding to the first check codes at the zeroth and second bits; the sixth bit participates in the first encoding operation corresponding to the first check codes at the first and second bits; the seventh bit participates in the first encoding operation corresponding to the first check codes at the zeroth, first and second bits. It should be understood that those skilled in the art may set the number of the first check codes and other encoding operation relationships as required, as long as the first check codes obtained by selecting each of the bits to perform the first encoding operation are not exactly the same.

In the embodiment of the disclosure, the first encoding operation is an exclusive OR (XOR) operation; and accordingly, the first encoding unit 112 is configured such that in the X-bit first binary number, the first check code at a lowest bit is XOR of data at first, third, fifth and seventh bits of all the bytes, the first check code at a highest bit is XOR of data at fourth, fifth, sixth and seventh bits of all the bytes, and the first check code at an intermediate bit is XOR of data at second, third, sixth and seventh bits of all the bytes.

It should be noted that in other embodiments, the first encoding operation may also be a not exclusive OR (XNOR) operation; and accordingly, the first encoding unit is configured such that in the X-bit binary number, the first check code at a lowest bit is XNOR of data at first, third, fifth and seventh bits of all the bytes, the first check code at a highest bit is XNOR of data at fourth, fifth, sixth and seventh bits of all the bytes, and the first check code at an intermediate bit is XNOR of data at second, third, sixth and seventh bits of all the bytes.

The principle of generating the first check code will be described below with reference to FIGS. 4 and 5.

As shown in FIGS. 4 and 5, "x" represents currently participating in the encoding operation in this row, i.e., XNOR or XOR; and the 128-bit data is partitioned into sixteen bytes numbered from zero to fifteen, each byte having eight bits. p10, p11 and p12 represent three first check codes; p13, p14, p15, p16 and p17 represent five second check codes; pc0 to pc7 represent eight formulas corresponding to p10 to p17 respectively when the encoding operation is performed. In each row, all positions marked by "x" represent that data corresponding to this column needs to participate in XOR or XNOR in this formula. The first check code(s) and the second check code(s) correspond to PB.

During the first encoding operation or the second encoding operation of the encoding stage during the write operation, the first encoding operation or the second encoding operation is performed by using the eight formulas from pc0 to pc7, the results of the operations are stored in p10 to p17, respectively, and p10 to p17 do not participate in the first encoding operation or the second encoding operation. At the decoding phase, formulas corresponding to rows are not changed, and the stored p10 to p17 need to participate in the operation. Therefore, in the table of FIG. 4, p10 to p17 are marked by "x" correspondingly, which will be described in detailed later.

In the embodiment of the disclosure, at the encoding stage during the write operation: for each byte, XOR or XNOR operation is performed on data at first, third, fifth and seventh bits of the byte, and then XOR or XNOR operation is performed on all XOR or XNOR results of sixteen bytes, which is formula pc0, and the result of the operation is given to p10. For each byte, XOR or XNOR operation is performed on data at second, third, sixth and seventh bits of the byte, and then XOR or XNOR operation is performed on all XOR or XNOR results of sixteen bytes, which is formula pc1, and the result of the operation is given to p11. For each byte, an XOR or XNOR operation is performed on data at fourth, fifth, sixth and seventh bits of the byte, and then XOR or XNOR operation is performed on all XOR or XNOR results of sixteen bytes, which is formula pc2, and the result of the operation is given to p12.

p10, p11, and p12 constitute a first binary number, and p10 is the lowest bit and p12 is the highest bit. In the case where only one of multiple data in the memory is erroneous, it is not difficult to find that:

When the data at the zeroth bit is erroneous, each of the first check codes p10, p11 and p12 is not affected since the zeroth bit does not participate in the formulas pc0, pc3 and pc3;

When the data at the first bit is erroneous, the first check code p10 is affected while the first check codes p11 and p12 are not affected since the first bit participates in the formula pc0 and does not participate in the formulas pc1 and pc2;

When the data at the second bit is erroneous, the first check codes p10 and p12 are not affected while the first check code p11 is affected since the second bit participates in the formula pc1;

When the data at the third bit is erroneous, the first check codes p10 and p11 are affected while the first check code p12 is not affected since the third bit participates in the formulas pc0 and pc1;

By analogy, when the data at the seventh bit is erroneous, each of the first check codes p10, p11 and p12 is affected since the seventh bit participates in the formulas pc0, pc1 and pc2.

It should be noted that a specific first check code is affected after a specific data is erroneous, it means that the specific first check code obtained by re-performing the first encoding operation after the specific data is erroneous, is different from the first check code formed before the data is erroneous.

It may be understood that for each formula, since the bits participating in the first encoding operation are the same among different bytes, it may be known at which bit an erroneous data is present by the first check code, but it cannot be detected in which byte an erroneous data is present at the corresponding bit. Therefore, it is also necessary to use the second check code to know in which byte an erroneous data is present at the corresponding bit.

The Y second check codes constitute a Y-bit binary number, where $2^Y$ is greater than or equal to M, and each of the second check codes is obtained by performing the second encoding operation on a subset of bytes.

Since $2^Y$ is greater than or equal to M, it can be ensured that the second check codes obtained by each of the bytes participating in the second encoding operation are not exactly the same. In the embodiment of the disclosure, different second check codes are obtained by performing the second encoding operation based on different subsets of bytes, so that for different second check codes, the bytes affecting the result of the second check code are different, to facilitate comprehensive analysis, to know the specific byte in which an erroneous data is present, to finally determine in which byte and at which bit the erroneous data is present, by considering the specific bit of the byte at which an erroneous data is present. It should be noted that the meaning of "affect" in the phrase of affecting the result of the second check code is the same as the meaning of "affect" as mentioned previously.

In the embodiment of the disclosure, Y is 5, so that errors of data of different bits may be identified, and the complexity of the hardware circuit of the first encoding unit 112 may be reduced. The second encoding operation may be an XOR operation, and accordingly, the first encoding unit 112 may include: a first-stage operation unit, configured to perform the XOR operation on all data of selected two of the bytes, and store multiple first operation results, each being an XOR operation result of the selected two of the bytes; and a second-stage operation unit, configured to perform the XOR operation on at least two of the first operation results, to generate the second check code, and generate the Y second check codes based on different encoding requirements. By a special design of the first encoding unit 112, the second-stage operation unit may reuse the first operation result of the first-stage operation unit, so that the first encoding unit 112 may be implemented by fewer hardware circuits, thereby reducing power consumption of the memory system.

In other embodiments, the first encoding operation may also be an XNOR operation, and accordingly, the first encoding unit may be configured to include: a first-stage operation unit, configured to perform the XNOR operation on all data of selected two of the bytes, and store multiple first operation results, each being an XNOR operation result of the selected two of the bytes; and a second-stage operation unit, configured to perform the XNOR operation on at least two of the first operation results, to generate the second check code, and generate the Y second check codes based on different encoding requirements.

In the embodiment of the disclosure, as shown in FIG. 4, for each of the bytes, an XOR operation is performed on data of all eight bits in the byte at the encoding stage during the write operation, to obtain an XOR result of the byte; then, a second encoding operation is performed on sixteen XOR results of all sixteen bytes according to five formulas pc3 to pc7, that is, the data marked by "X" in a row of the table participate in the operation to obtain second check codes pc13 to pc17. It may be understood that the second check codes pc13 to pc17 do not participate in the encoding operation at the encoding stage, and the second check codes pc13 to pc17 also need to participate in the operation at the subsequent decoding stage (or referred to as the decoding stage). Therefore, the second check codes pc13 to pc17 are marked by "X" in FIG. 4, which will be explained later and will not be elaborated here.

In the embodiment of the disclosure, the M bytes are divided into zeroth to fifteenth bytes which are incremental by a natural number; the Y second check codes are divided into third to seventh second check codes which are incremental by a natural number; the acquisition of the five second check codes are as follows.

The third second check code (corresponding to p13 in FIG. 4) is an XOR or XNOR of all data of the zeroth, second, third, fourth, fifth, sixth and eighth bytes; the fourth second check code (corresponding to p14 in FIG. 4) is an XOR or XNOR of all data of the zeroth, first, fourth, fifth, seventh, ninth, tenth and twelfth bytes; the fifth second check code (corresponding to p15 in FIG. 4) is an XOR or XNOR of all data of the first, second, fourth, sixth, ninth, eleventh, thirteenth and fourteenth bytes; the sixth second check code (corresponding to p16 in FIG. 4) is an XOR or XNOR of all data of the third, fifth, sixth, seventh, tenth, eleventh, fourteenth and fifteenth bytes; the seventh second check code (corresponding to p17 in FIG. 4) is an XOR or XNOR of all data of the eighth, ninth, tenth, eleventh, twelfth, thirteenth and fifteenth bytes.

It should be noted that each of the second check codes is obtained by the XOR operation; in an embodiment, each of the second check codes is obtained by the XNOR operation.

Referring to FIG. 6, a corresponding circuit, configured to obtain the second check codes, of the first encoding unit 112 is designed to: perform an XOR operation on XOR results of byte 0 and byte 4 to obtain a result 0_4; perform an XOR operation on results of byte 2 and byte 6 to obtain a result 2_6; perform an XOR operation on results of byte 3 and byte 5 to obtain a result 3_5; perform an XOR operation on results of byte 1 and byte 5 to obtain a result 1_5; perform an XOR operation on results of byte 1 and byte 4 to obtain a result 1_4.

It is not difficult to find that as shown in FIG. 7, FIG. 7 schematically illustrates a schematic principle diagram of performing a second encoding operation on all bytes. Compared to bytes 0 to 7, the same set of circuits may be used to complete the operation on bytes 8 to 15, that is, only the input is changed, and the same operation may be performed on bytes 8 to 15 to obtain a result 9_13, a result 10_12, a result 11_15, a result 10_14 and a result 11_14. Furthermore, in addition to these operations using the same circuit, it is necessary to perform an XOR operation on byte 6 and byte 7 to obtain a result 6_7, and perform an XOR operation on results of byte 7 and byte 9 to obtain a result 7_9.

The XOR operation is performed according to the requirement of formulas pc3 to pc7: for example, the XOR operation is performed on the result 0_4, the result 2_6, the result 3_5, and the XOR result of the byte 8 according to the formula pc3 to obtain the second check code p13; the XOR operation is performed on the result 0_4, the result 1_5, the result 7_9, and the result 10_12 according to the formula pc4 to obtain the second check code p14. The acquisition of the second check codes p15, p16 and p17 are not described one by one in detail. It may be understood that the result 0_4, the result 2_6, and the like may be reused to save circuit resources.

Furthermore, in the embodiment of the disclosure, the first encoding unit 112 may be further configured such that a number of times that each of the bytes participates in the second encoding operation is a, here a is a positive integer greater than or equal to $(Y-1)/2$ and less than or equal to $(Y+1)/2$. With this configuration, in the decoding circuit required to perform the subsequent decoding phase, the wire and area of the circuit may be reduced, and the decoding speed may be increased.

It may be known from the foregoing analysis that during the write operation, the first encoding operation is performed by using the first encoding unit 112 (referring to FIG. 6) to acquire the first check code(s), and the second encoding operation is performed by using the first encoding unit 112 to acquire the second check code(s). Since the acquisition of the first updated check code is the same as the acquisition of the first check code, and the acquisition of the second updated check code is the same as the acquisition of the second check code, the second encoding unit 122 will not be elaborated here.

In the embodiment of the disclosure, during the read operation, the first updated check code(s) is/are obtained by using the second encoding unit 122 (referring to FIG. 6) performing the first encoding operation, and the second updated check code(s) is/are obtained by using the second encoding unit 122 to perform the second encoding operation. Accordingly, the first encoding unit 112 and the second encoding unit 122 may be the same encoding unit.

The first operation code(s) is/are obtained based on the first check code(s) and the first updated check code(s), and the second operation code(s) is/are obtained based on the second check code(s) and the second updated check code(s). In the embodiment of the disclosure, the first operation code(s) is/are generated by comparing the first check code(s) and the first updated check code(s), and the second operation code(s) is/are generated by comparing the second check code(s) and the second updated check code(s).

Accordingly, the error correction system further includes: a comparison module 103 (referring to FIG. 6), configured to perform an XOR operation or an XNOR operation on the first check codes and the first updated check codes to obtain the X first operation codes, and perform the XOR or XNOR operation on the second check codes and the second updated check codes to obtain the Y second operation codes.

In the embodiment of the disclosure, with reference to FIG. 4 and the forgoing descriptions of the principle of generating the first check code(s) and the second check code(s), the first operation code p20 is obtained by performing the XOR or XNOR operation on the received data of different bits in each of the bytes and the first check code p10 by using the formula pc0; the first operation code p21 is obtained by performing the XOR or XNOR operation on the received data of different bits in each of the bytes and the first check code p11 by using the formula pc1; the first operation code p22 is obtained by performing the XOR or XNOR operation on the received data of different bits in each of the bytes and the first check code p12 by using the formula pc2. The first operation code and the second operation code correspond to PB in FIG. 4.

Similarly, for the second check code and the second operation code, the encoding operation at the decoding stage is to perform an XOR operation on the second check code p13, p14, p15, p16 or p17 respectively based on the forgoing encoding operation at the encoding stage, to obtain the second operation code p23, p24, p25, p26 or p27 respectively.

p20, p21 and p22 constitute a third binary number, and p20 is the lowest bit and p22 is the highest bit. In the case where only one of multiple data in the memory is erroneous, when the third encoding operation is an XOR (which may also be XNOR in other embodiments) operation, it is not difficult to find that:

When the data at the zeroth bit is erroneous, each of the first operation codes p20, p21 and p22 is not affected and is zero since the zeroth bit does not participate in the formulas pc0, pc3 and pc3, and a decimal number corresponding to the third binary number 000 is zero, so that it is detected that the data at the zeroth bit is erroneous.

When the data at the first bit is erroneous, the first operation code p20 is affected and is 1 while each of the first operation codes p21 and p22 is not affected and is zero since the first bit participates in the formula pc0 and does not participate in the formulas pc1 and pc2, and a decimal number corresponding to the third binary number 001 is 1, so that it is detected that the data at the first bit is erroneous.

When the data at the second bit is erroneous, the first operation code p20 is zero, the first operation code p21 is 1 while the first operation code p22 is zero since the second bit participates in the formula pc1, and a decimal number corresponding to the third binary number 010 is 2, so that the erroneous data at the second bit is detected.

When the data at the third bit is erroneous, each of the first operation codes p20 and p21 is 1 while the first operation code p22 is zero since the third bit participates in the formulas pc0 and pc1, and a decimal number corresponding to the third binary number 011 is 3, so that the erroneous data at the third bit is detected.

By analogy, when the data at the seventh bit is erroneous, each of the first operation codes p20, p21 and p22 is 1 since the seventh bit participates in the formulas pc0, pc1 and pc2, and a decimal number corresponding to the third binary number 111 is seven, so that the erroneous data at the seventh bit is detected.

In the embodiment of the disclosure, the comparison module 103 (referring to FIG. 6) includes: X first comparison circuits (not shown), each configured to receive and perform an XOR or XNOR operation on a respective one of the first check codes and a respective one of the first updated check codes to obtain a respective one of the first operation codes; and Y second comparison circuits (not shown), each configured to receive and perform an XOR or XNOR operation on a respective one of the second check codes and a respective one of the second updated check codes to obtain a respective one of the second operation codes.

Figure 8:
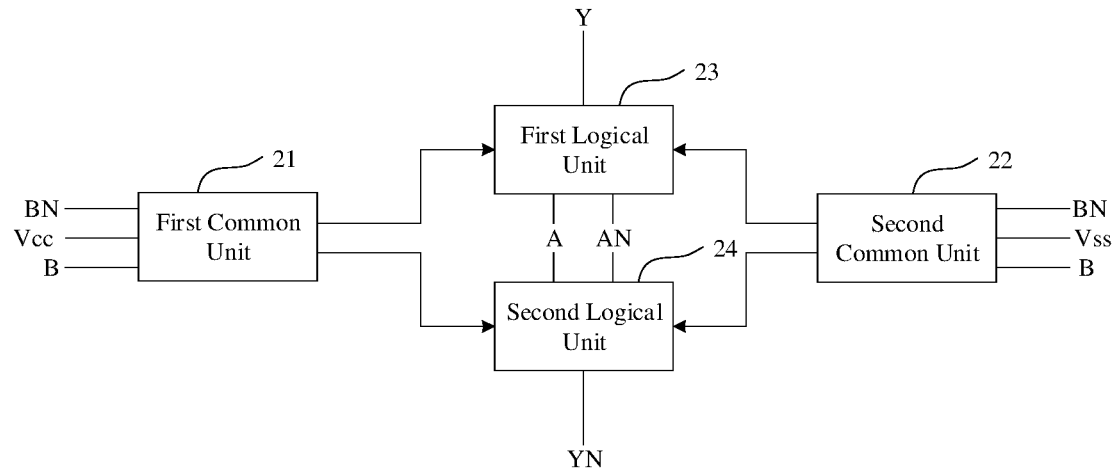
FIG. 8 is a functional block diagram of a first comparison circuit or a second comparison circuit in an error correction system according to an embodiment of the disclosure.
Figure 9:
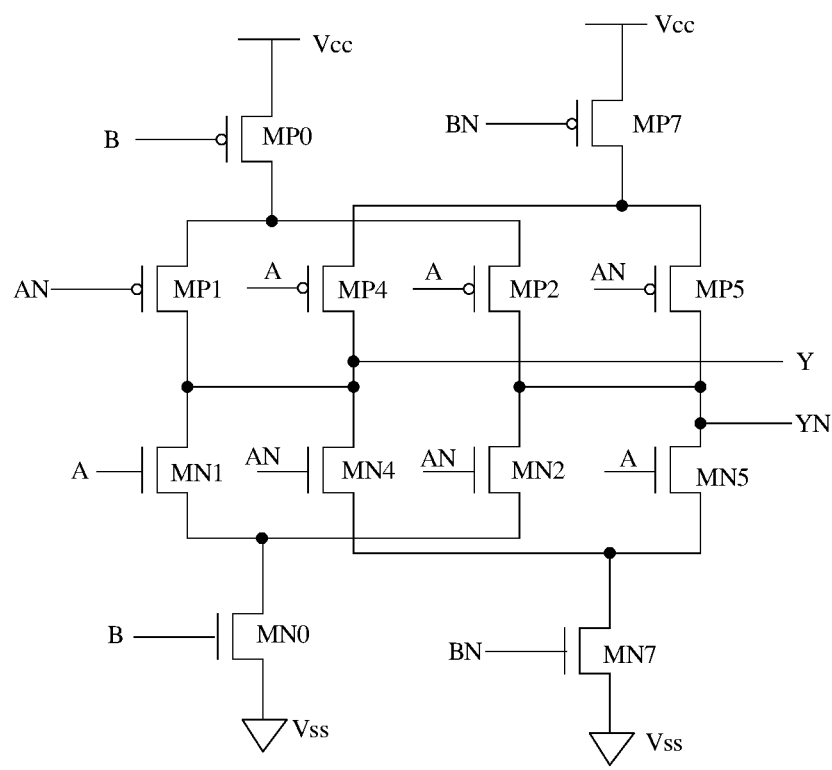
FIG. 9 is a schematic structural diagram of a first comparison circuit or a second comparison circuit in an error correction system according to an embodiment of the disclosure.

FIG. 8 is a functional block diagram of a first comparison circuit or a second comparison circuit in an error correction system according to an embodiment of the disclosure, and FIG. 9 is a schematic structural diagram of a first comparison circuit or a second comparison circuit in an error correction system according to an embodiment of the disclosure.

In the embodiment of the disclosure, referring to FIG. 8, the first comparison circuit or the second comparison circuit includes: a common module, connected to a power supply signal Vcc and a ground signal Vss, and configured to control output of the power supply signal Vcc or the ground signal Vss based on a first signal B and a second signal BN which are inverted; a first logical unit 23, connected to the common module, and configured to receive a third signal A and a fourth signal AN which are inverted, and output a first operation signal Y which is an XOR of the first signal B and the third signal A; a second logical unit 24, connected to the common module, and configured to receive the third signal A and the fourth signal AN, and output a second operation signal YN which is an XNOR of the first signal B and the third signal A. Here as to the first comparison circuit, the first check code is used as the first signal, and the first updated check code is used as the third signal; and as to the second comparison circuit, the second check code is used as the first signal, and the second updated check code is used as the third signal.

In the embodiment of the disclosure, referring to FIG. 8, the common module includes: a first common unit 21, connected to the power supply signal Vcc and configured to control output of the power supply signal Vcc based on the first signal B and the second signal BN; and a second common unit 22, connected to the ground signal Vss and configured to control output of the ground signal Vss based on the first signal B and the second signal BN, where the first logical unit 23 is connected between the first common unit 21 and the second common unit 22, and the second logical unit 24 is connected between the first common unit 21 and the second common unit 22.

In the embodiment of the disclosure, referring to FIG. 9, the first common unit 21 (referring to FIG. 8) includes: a zeroth P-channel Metal Oxide Semiconductor (PMOS) transistor MP0, having a gate for receiving the first signal B and a source connected to the power supply signal Vcc; and a seventh PMOS transistor MP7, having a gate for receiving the second signal BN and a source connected to the power supply signal Vcc. When the first signal B is at a high level and the second signal BN is at a low level, the zeroth PMOS transistor MP0 is turned off and the seventh PMOS transistor MP7 is turned on; and when the first signal B is at a low level and the second signal BN is at a high level, the zeroth PMOS transistor MP0 is turned on and the seventh PMOS transistor MP7 is turned off.

The second common unit 22 (referring to FIG. 8) includes: a zeroth N-channel Metal Oxide Semiconductor (NMOS) transistor MN0, having a gate for receiving the first signal B and a source connected to the ground signal Vss; and a seventh NMOS transistor MN7, having a gate for receiving the second signal BN and a source connected to the ground signal Vss. When the first signal B is at a high level and the second signal BN is at a low level, the zeroth NMOS transistor MN0 is turned on and the seventh NMOS transistor MN7 is turned off; and when the first signal B is at a low level and the second signal BN is at a high level, the zeroth NMOS transistor MN0 is turned off and the seventh NMOS transistor MN7 is turned on.

In the embodiment of the disclosure, the first logical unit 23 (referring to FIG. 8) includes: a first PMOS transistor MP1, having a gate for receiving the fourth signal AN and a source connected to a drain of the zeroth PMOS transistor MP0; a first NMOS transistor MN1, having a gate for receiving the third signal A, a drain connected to a drain of the first PMOS transistor MP1, and a source connected to a drain of the zeroth NMOS transistor MN0; a fourth PMOS transistor MP4, having a gate for receiving the third signal A and a source connected to a drain of the seventh PMOS transistor MP7; and a fourth NMOS transistor MN4, having a gate for receiving the fourth signal AN, a drain connected to a drain of the fourth PMOS transistor MP4, and a source connected to a drain of the seventh NMOS transistor MN7.

The second logical unit 24 (referring to FIG. 8) includes: a second PMOS transistor MP2, having a gate for receiving the third signal A and a source connected to a drain of the zeroth PMOS transistor MP0; a second NMOS transistor MN2, having a gate for receiving the fourth signal AN, a drain connected to a drain of the second PMOS transistor MP2, and a source connected to a drain of the zeroth NMOS transistor MN0; a fifth PMOS transistor MP5, having a gate for receiving the fourth signal AN and a source connected to a drain of the seventh PMOS transistor MP7; and a fifth NMOS transistor MN5, having a gate for receiving the third signal A, a drain connected to a drain of the fifth PMOS transistor MP5, and a source connected to a drain of the seventh NMOS transistor MN7.

Furthermore, a drain of the first PMOS transistor MP1 is connected to a drain of the fourth PMOS transistor MP4, to output a first operation signal Y; a drain of the second PMOS transistor MP2 is connected to a drain of the fifth PMOS transistor MP5, to output a second operation signal YN.

The first logical unit 23 configured to implement XOR logic and the second logical unit 24 configured to implement XNOR logic are connected to the same common module, thus an area occupied by the structure of the circuit of the common module may be reduced, which facilitates to further set the circuit area corresponding to the first logical unit 23 and the circuit area corresponding to the second logical unit 24 respectively to be larger, so that driving capabilities of the first logical unit 23 and the second logical unit 24 may be improved, and operation speeds of the comparison system performing the XOR operation and the XNOR operation may be further improved, and the speed of at least one of error detection or error correction of the error correction system may be improved.

Figure 10:
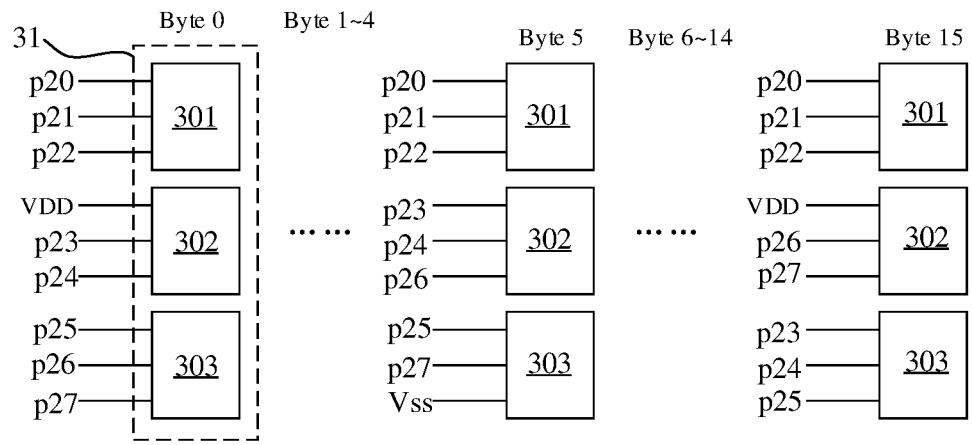
FIG. 10 is a schematic structural diagram of a decoding unit corresponding to a byte according to an embodiment of the disclosure.

The decoding unit 31 will be further described below with reference to the aforementioned error correction system generating the first check codes, the second check codes, the first operation codes, and the second operation codes. FIG. 10 is a schematic structural diagram of a decoding unit corresponding to a byte according to an embodiment of the disclosure, and FIG. 11 is an enlarged schematic structural diagram of a decoding unit corresponding to byte 5 in FIG. 10.

Figure 11:
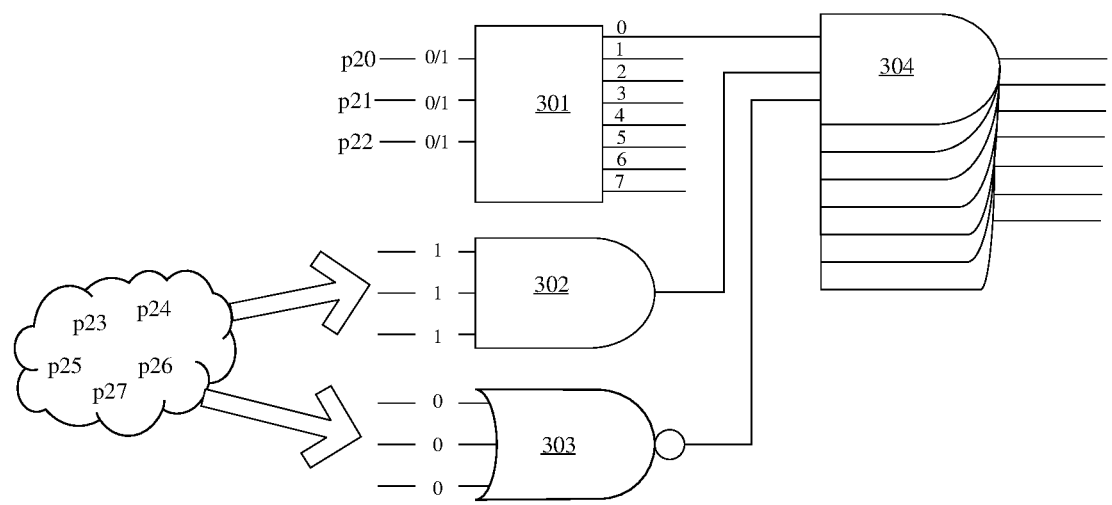
FIG. 11 is an enlarged schematic structural diagram of a decoding unit corresponding to byte 5 in FIG. 10.

Referring to FIGS. 10 and 11, in the embodiment of the disclosure, X is 3 and N is 8; accordingly, the decoder 301 has three input terminals and eight output terminals, and a number of the second AND gate units 304 is 8. In the embodiment of the disclosure, the decoder 301 is a three-eight decoder having three input terminals for receiving three first operation codes, and eight output terminals for outputting eight first decoded signals, each characterizing status of data of one of eight bits in the same byte respectively.

In FIG. 10, the first operation codes are marked by p20, p21 and p22, and the second operation codes are marked by p23, p24, p25, p26 and p27. In the embodiment of the disclosure, each of the decoding units 31 performs decoding on the X first operation codes and the Y second operation codes. That is, the number of decoding units 31 is the same as the number of bytes.

It should be noted that only a connection between one first decoded signal and one second AND gate unit 304 are schematically illustrated in FIG. 11.

In the embodiment of the disclosure, X is 3 and N is 8, the decoder 301 is a three-eight decoder; the decoder 301 has three input terminals for receiving three first operation codes, and eight output terminals for outputting eight first decoded signals, each characterizing status of data of one of eight bits in the same byte respectively.

In the embodiment of the disclosure, each of the first operation codes p20, p21 and p22 is zero or one, and the output terminals are marked by zero to seven. When an error occurs at the zeroth bit, and the zeroth bit does not participate in the encoding operation of the first operation codes, then each of p20, p21 and p22 is zero, and accordingly, the "zero" output terminal is one, and each of the remaining output terminals is zero. When an error occurs at the first bit, p20 is one and each of p21 and p22 is zero, and accordingly, the "one" output terminal is one, and each of the remaining output terminals is zero. By analogy, when an error occurs at the seventh bit, each of p20, p21 and p22 is one, and accordingly, the "seven" output terminal is one, and each of the remaining output terminals is zero.

It should be noted that in other embodiments, the number of the input terminals and the number of the output terminals of the decoder may be reasonably set according to the first check code(s) and the number of bits in each of the bytes.

The first AND gate unit 302 has a characteristic that the output terminal is one when each of the input terminals is one, and the output terminal is zero when one or more of the input terminals are zero. In the embodiment of the disclosure, the first AND gate unit 302 has three input terminals, and is further configured to connect one of the input terminals of the first AND gate unit 302 to a power supply VDD when a number of the selected operation codes is 2.

The NOR gate unit 303 has a characteristic that the output terminal is one when each of the input terminals is zero, and the output terminal is zero when one or more of the input terminals are one. In the embodiment of the disclosure, the NOR gate unit 303 has three input terminals, and is further configured to connect one of the input terminals of the NOR gate unit 303 to the ground Vss when a number of the unselected operation codes is 2.

In the embodiment of the disclosure, the selected operation code corresponds to a second operation code obtained after performing comparison on the second check codes corresponding to the byte; and the unselected operation code corresponds to a second operation code obtained after performing comparison on the remaining second check codes other than the second check codes corresponding to the byte.

For example, for byte 0, the second operation codes p23 and p24 are second operation codes obtained by performing comparison on the second check codes p13 and p14 corresponding to byte 0, and the second operation codes p23 and p24 are input to the input terminals of the first AND gate unit 302, and the remaining second operation codes p25, p26 and p27 are input to the input terminals of the NOR gate unit 303. For byte 1, the second operation codes p24 and p25 are second operation codes obtained by performing comparison on the second check codes p14 and p15 corresponding to byte 1, and the second operation codes p24 and p25 are input to the input terminals of the first AND gate unit 302, and the remaining second operation codes p23, p26 and p27 are input to the input terminals of the NOR gate unit 303. For byte 4, the second operation codes p23, p24 and p25 are input to the input terminals of the first AND gate unit 302, and the remaining second operation codes p26 and p27 are input to the input terminals of the NOR gate unit 303. Operations for other bytes will not be enumerated one by one.

The number of the second AND gate units 304 is the same as the number of bits in the same byte. In the embodiment of the disclosure, N is eight, and accordingly, there are eight second AND gate units 304, and it is determined whether the byte has erroneous data and the bit at which error occurs according to the output of the eight second AND gate units 304.

It is not difficult to find that in the embodiment of the disclosure the decoding units 31 have same circuits for all the bytes except that the wirings of the input terminals are different, and the wiring of the input terminals of the first AND gate unit 302 and the NOR gate unit 303 corresponding to each of the bytes is determined by the five formulas pc3 to pc7 in FIG. 4. The second operation codes obtained by performing comparison on the second check codes corresponding to each of the bytes, are connected to the input terminals of the first AND gate unit 302, and the second operation codes obtained by performing comparison on the remaining second operation codes other than the second check codes corresponding to each of the bytes, are connected to the input terminals of the NOR gate unit 303. Furthermore, unused input terminals of the first AND gate unit 302 are connected to the power supply, unused input terminal(s) of the NOR gate unit 303 is grounded, and the first operation code is connected to an input terminal of the decoder 301. Therefore, the decoding unit 31 uses only eight wires to connect the input terminals, and each of the wires transmits one of the first operation codes or one of the second operation codes, thereby saving the wires and area, while facilitating to improve the decoding speed.

In order to facilitate understanding of the decoding unit 31, a decoding unit corresponding to byte 5 is used as an example, and the decoding unit 31 will be described in more detail below with reference to the operating principle of the decoding unit 31.

When each of the outputs of the eight second AND gate units 304 is zero, it means that none of the data in the byte are erroneous.

When one of the outputs of the eight second AND gate units 304 is one, it means that one bit of the data in the byte is erroneous. In the embodiment of the disclosure, data of the byte is erroneous, each of the second operation codes p23, p24 and p26 is affected and is one and the output of the first AND gate unit 302 is one, each of the unselected operation codes p25 and p27 is not affected and is zero and the output of the NOR gate unit 303 is one. At this time, when one of the N second AND gate units 304 corresponding to a first decoded signal, has an output of 1, it can be determined that data at the bit corresponding to the first decoded signal is erroneous.

It may be understood that in the embodiment of the disclosure, data at a corresponding bit being erroneous when the first decoded signal is 1 is used as an example, and data at the corresponding bit is not erroneous when the first decoded signal is 0. In other embodiments, it may be provided that when the first decoded signal is 0, data at a bit corresponding to the first decoded signal is erroneous, and when the first decoded signal is 1, data at the bit corresponding to the first decoded signal is not erroneous. Accordingly, those skilled in the art may design other conditions according to requirements, for example, the first decoded signal is connected to an NOR gate circuit and output, etc.

It should be noted that when none of the data in the M bytes are erroneous and only one of the X first check codes is erroneous, one of the first operation codes is one, and then one of the outputs of the decoder 301 is one. However, since the Y second check codes are not erroneous, each of the second operation codes is zero, and then the output of the first AND gate unit 302 and the output of the second AND gate unit 304 are zero, which means that none of the data in the M bytes are erroneous. When none of the data in the M bytes are erroneous and only one of the Y second check codes is erroneous, the first operation code is zero, and then the "zero" output terminal of the decoder 301 is one. However, since none of the remaining Y−1 second check codes is erroneous, each of Y−1 second operation codes corresponding thereto is zero, the output of the first AND gate unit 302 is zero, and then the output of the second AND gate unit 304 is zero, which means that none of the data in the M bytes are erroneous.

Embodiments of the disclosure provide an error correction system, the special design of the error correction system implements ECC, and may detect and correct one-bit error, and may also reduce hardware circuits, thereby reducing power consumption of the error correction system and increasing encoding speed and decoding speed. Furthermore, the special design of the first check code and the second check code allows the difference in encoding time for all data combinations to be small, and the difference in decoding time for all data combinations to be small, thereby reducing the requirement on the control circuit.

It may be understood by those of ordinary skill in the art that the embodiments as described above are specific embodiments of the disclosure, and that various changes may be made to the form and detail thereof in practical applications without departing from the spirit and scope of the disclosure. Any of those skilled in the art may make their own changes and modifications without departing from the spirit and scope of the disclosure, therefore the scope of protection of the disclosure shall be subject to the scope defined by the claims.

Embodiments of the disclosure provide an error correction system applied to a memory system which is configured to, during a read or write operation, write or read multiple data, where the multiple data are divided into M bytes, each having N data with different bits, and during a decoding stage, the memory system generates X first operation codes and Y second operation codes, here the first operation codes are configured for at least one of error detection or error correction on the N data, and the second operation codes are configured for at least one of error detection or error correction on the M bytes; in which the error correction system includes: M decoding units, each corresponding to a respective one of the bytes; here the decoding unit includes: a decoder, configured to receive the X first operation codes and output N first decoded signals, and configured to locate one or more bits of the erroneous data; a first AND gate unit and an NOR gate unit, configured to locate erroneous bytes; and N second AND gate units, each having an input terminal connected to a respective output terminal of the first AND gate unit and a respective output terminal of the NOR gate unit, and configured to determine whether the respective byte is erroneous and to locate one or more bits of the erroneous data.

In the embodiment of the disclosure, the decoding units, each corresponding to a respective one of the bytes, may be configured as same circuits, except that the first operation codes and the second operation codes connected to input terminals of different decoding units are different, which is conducive to saving the wires and areas of all the decoding units in the error correction system, and performing decoding on all the bytes at the same time for at least one of error detection or error correction. Therefore, error detection and error correction speeds of the error correction system may be improved.

The invention claimed is:

1. An error correction system, applied to a memory system which is configured to, during a read or write operation, write or read a plurality of data, wherein the plurality of data are divided into M bytes, each having N data with different bits, and the memory system has an encoding stage and a decoding stage, during the decoding stage, the error correction system generates X first operation codes and Y second operation codes based on the memory system, wherein the first operation codes are configured for at least one of error detection or error correction on the N data, and the second operation codes are configured for at least one of error detection or error correction on the M bytes; the error correction system comprising:

M decoding units, each corresponding to a respective one of the bytes, and configured to perform decoding on the X first operation codes and the Y second operation codes to determine whether the respective byte has erroneous data and to locate one or more bits of the erroneous data; wherein each of the decoding units comprises:

a decoder, configured to receive the X first operation codes and output N first decoded signals, each of the N first decoded signals corresponding to a respective one bit of the N data, and N being greater than X;

a first AND gate unit, configured to receive and perform a logical AND operation on Z selected operation codes, the selected operation codes being a subset of the Y second operation codes corresponding to the respective byte;

an NOR gate unit, configured to receive and perform a logical NOR operation on (Y−Z) unselected operation codes, the unselected operation codes being second operation codes other than the selected operation codes; and N second AND gate units, each having an input terminal connected to an output terminal of the first AND gate unit, an output terminal of the NOR gate unit and one of the first decoded signals, wherein at least one of error detection or error correction is performed on the memory system based on an output of the N second AND gate units, wherein each of X, Y and N is a positive natural number, and Z is an integer which is greater than or equal to (Y−1)/2 and smaller than or equal to (Y+1)/2.

2. The error correction system of claim 1, wherein X is 3 and N is 8, the decoder has three input terminals and eight output terminals; and a number of the second AND gate units is 8.

3. The error correction system of claim 2, wherein Y is 5, the first AND gate unit has three input terminals, and is further configured to connect one of the input terminals of the first AND gate unit to a power supply when a number of the selected operation codes is 2.

4. The error correction system of claim 1, wherein Y is 5, the NOR gate unit has three input terminals, and is further configured to ground one of the input terminals of the NOR gate unit when a number of the unselected operation codes is 2.

5. The error correction system of claim 1, further comprising:

an encoding module, configured to, during the encoding stage of the read operation and the write operation, generate X first check codes, each based on a subset of the data at fixed bits among all the bytes, and to generate Y second check codes, each based on all data in a subset of the bytes, wherein the X first check codes are configured for at least one of error detection or error correction on the N data in each of the bytes, and the Y second check codes are configured for at least one of error detection or error correction on the M bytes, and each of X and Y is a positive natural number.

6. The error correction system of claim 5, wherein the encoding module comprises:

a first encoding unit, configured to acquire the X first check codes and the Y second check codes based on a plurality of data written during the write operation; and a second encoding unit, configured to obtain X first updated check codes and Y second updated check codes based on a plurality of data to be read during the read operation, wherein a way of obtaining the first updated check codes is the same as a way of obtaining the first check codes, and a way of obtaining the second updated check codes is the same as a way of obtaining the second check codes, wherein the first operation codes are obtained based on the first check codes and the first updated check codes, and the second operation codes are obtained based on the second check codes and the second updated check codes.

7. The error correction system of claim 6, wherein the first encoding unit and the second encoding unit are the same encoding unit.

8. The error correction system of claim 6, further comprising:

a comparison module, configured to perform an exclusive OR (XOR) operation or a not exclusive OR (XNOR) operation on the first check codes and the first updated check codes to obtain the X first operation codes, and perform the XOR or XNOR operation on the second check codes and the second updated check codes to obtain the Y second operation codes.

9. The error correction system of claim 8, wherein the comparison module comprises:

X first comparison circuits, each configured to receive and perform an XOR or XNOR operation on a respective one of the first check codes and a respective one of the first updated check codes to obtain a respective one of the first operation codes; and Y second comparison circuits, each configured to receive and perform an XOR or XNOR operation on a respective one of the second check codes and a respective one of the second updated check codes to obtain a respective one of the second operation codes.

10. The error correction system of claim 9, wherein the first comparison circuit or the second comparison circuit comprises:

a common module, connected to a power supply signal and a ground signal, and configured to control output of the power supply signal or the ground signal based on a first signal and a second signal which are inverted;

a first logical unit, connected to the common module, and configured to receive a third signal and a fourth signal which are inverted, and output a first operation signal which is an XOR of the first signal and the third signal;

a second logical unit, connected to the common module, and configured to receive the third signal and the fourth signal, and output a second operation signal which is an XNOR of the first signal and the third signal, wherein as to the first comparison circuit, the first check code is used as the first signal, and the first updated check code is used as the third signal; and as to the second comparison circuit, the second check code is used as the first signal, and the second updated check code is used as the third signal.

11. The error correction system of claim 10, wherein the common module comprises:

a first common unit, connected to the power supply signal and configured to control output of the power supply signal based on the first signal and the second signal; and a second common unit, connected to the ground signal and configured to control output of the ground signal based on the first signal and the second signal, wherein the first logical unit is connected between the first common unit and the second common unit, and the second logical unit is connected between the first common unit and the second common unit.

12. The error correction system of claim 11, wherein the first common unit comprises:

a zeroth P-channel Metal Oxide Semiconductor (PMOS) transistor, having a gate for receiving the first signal and a source connected to the power supply signal; and a seventh PMOS transistor, having a gate for receiving the second signal and a source connected to the power supply signal; and the second common unit comprises:

a zeroth N-channel Metal Oxide Semiconductor (NMOS) transistor, having a gate for receiving the first signal and a source connected to the ground signal; and a seventh NMOS transistor, having a gate for receiving the second signal and a source connected to the ground signal.

13. The error correction system of claim 12, wherein the first logical unit comprises:
   a first PMOS transistor, having a gate for receiving the fourth signal and a source connected to a drain of the zeroth PMOS transistor;
   a first NMOS transistor, having a gate for receiving the third signal, a drain connected to a drain of the first PMOS transistor, and a source connected to a drain of the zeroth NMOS transistor;
   a fourth PMOS transistor, having a gate for receiving the third signal and a source connected to a drain of the seventh PMOS transistor; and
   a fourth NMOS transistor, having a gate for receiving the fourth signal, a drain connected to a drain of the fourth PMOS transistor, and a source connected to a drain of the seventh NMOS transistor.

14. The error correction system of claim 12, wherein the second logical unit comprises:
   a second PMOS transistor, having a gate for receiving the third signal and a source connected to a drain of the zeroth PMOS transistor;
   a second NMOS transistor, having a gate for receiving the fourth signal, a drain connected to a drain of the second PMOS transistor, and a source connected to a drain of the zeroth NMOS transistor;
   a fifth PMOS transistor, having a gate for receiving the fourth signal and a source connected to a drain of the seventh PMOS transistor; and
   a fifth NMOS transistor, having a gate for receiving the third signal, a drain connected to a drain of the fifth PMOS transistor, and a source connected to a drain of the seventh NMOS transistor.

15. The error correction system of claim 1, wherein the memory system comprises a memory chip, and the M decoding units are integrated within the memory chip.

\* \* \* \* \*